(12) United States Patent
Lara

(10) Patent No.: US 9,576,826 B2
(45) Date of Patent: Feb. 21, 2017

(54) SYSTEMS AND METHODS FOR CONTROLLING WAFER-BREAKER DEVICES

(71) Applicant: SKYWORKS SOLUTIONS, INC., Woburn, MA (US)

(72) Inventor: Cesar D. Lara, Mexicali (MX)

(73) Assignee: Skyworks Solutions, Inc., Woburn, MA (US)

( * ) Notice: Subject to any disclaimer, the term of this patent is extended or adjusted under 35 U.S.C. 154(b) by 435 days.

(21) Appl. No.: 14/291,397

(22) Filed: May 30, 2014

(65) Prior Publication Data

US 2015/0346712 A1 Dec. 3, 2015

(51) Int. Cl.
| H01L 21/67 | (2006.01) |
| H01L 21/304 | (2006.01) |
| H01L 21/66 | (2006.01) |
| B81C 1/00 | (2006.01) |
| B81C 99/00 | (2010.01) |

(52) U.S. Cl.
CPC ..... *H01L 21/67092* (2013.01); *B81C 1/00888* (2013.01); *B81C 99/001* (2013.01); *B81C 99/004* (2013.01); *H01L 21/304* (2013.01); *H01L 21/67253* (2013.01); *H01L 22/34* (2013.01); *B23K 2201/40* (2013.01); *G05B 2219/45031* (2013.01); *H01L 2924/1461* (2013.01); *Y10T 225/30* (2015.04)

(58) Field of Classification Search
CPC .. H01L 21/78; H01L 22/34; H01L 2924/1461; B81C 1/00888; B81C 99/001; B81C 99/004; Y10T 83/0341; Y10T 225/30; B23K 2201/40

See application file for complete search history.

(56) References Cited

U.S. PATENT DOCUMENTS

| 3,601,296 | A | * | 8/1971 | Pick | H01L 21/00 225/103 |
| 7,262,115 | B2 | * | 8/2007 | Baylis | B28D 5/0011 225/96.5 |
| 7,378,293 | B2 | * | 5/2008 | Diep | B81C 1/00888 257/E27.001 |
| 7,943,489 | B2 | * | 5/2011 | Koehl | B26F 3/002 225/94 |
| RE43,605 | E | * | 8/2012 | O'Brien | B23K 26/032 219/121.62 |
| 8,742,288 | B2 | * | 6/2014 | Kwok | B23K 26/0738 219/121.73 |

(Continued)

*Primary Examiner* — Crystal J Barnes-Bullock
(74) *Attorney, Agent, or Firm* — Chang & Hale LLP

(57) ABSTRACT

Systems and methods for controlling wafer-breaker devices. In some embodiments, a controller for a semiconductor wafer singulation apparatus can be configured to receive an input signal having information about at least one singulation parameter. The controller can be further configured to generate an output signal based on the input signal to effectuate an operation associated with the singulation parameter. The controller can be further configured to disable manual control of the singulation parameter. In some embodiments, such a controller can be implemented, for example, in a control module, in a kit for modifying an existing singulation apparatus, as an integral part of a singulation apparatus, or any combination thereof.

20 Claims, 6 Drawing Sheets

(56) References Cited

U.S. PATENT DOCUMENTS

2005/0064683 A1\* 3/2005 Farnworth ............ H01L 21/304
                                                        438/464
2013/0299947 A1\* 11/2013 Uehling .................. H01L 22/20
                                                        257/620

\* cited by examiner

SYSTEMS AND METHODS FOR CONTROLLING WAFER-BREAKER DEVICES

BACKGROUND

Field

The present disclosure generally relates to singulation of semiconductor wafers, and more particularly, to systems and methods for controlling wafer-breaker devices.

Description of the Related Art

Integrated circuits (ICs) such as radio-frequency (RF) ICs are typically fabricated in multiple units on a semiconductor wafer. Once completed, the units are singulated from the wafer to form individual units. Such individual units can be processed further to yield, for example, packaged devices. Such a singulation process can be achieved in different manners.

SUMMARY

In some implementations, the present disclosure relates to a controller for a semiconductor wafer singulation apparatus. The controller includes a processor configured to receive an input signal having information about at least one singulation parameter. The processor is further configured to generate an output signal based on the input signal to effectuate an operation associated with the singulation parameter. The processor is further configured to disable manual control of the singulation parameter.

In some embodiments, the singulation apparatus can include a roller breaker apparatus. The singulation parameter(s) can include one or more of a first pressure setting for applying pressure along a first direction of a wafer, a second pressure setting for applying pressure along a second direction of the wafer, and a roller speed setting.

In some embodiments, the controller can further include a memory in communication with the processor. The memory can be configured to store at least a portion of the information about the singulation parameter. The processor can be configured to determine whether the information about the singulation parameter is stored in the memory. The processor can be configured to obtain the information about the singulation parameter from the memory if the information is stored in the memory. The processor can be further configured to notify an operator if the information about the singulation parameter is not stored in the memory.

In some embodiments, the controller can be an integral part of the singulation apparatus. The controller can also be an add-on component for the singulation apparatus.

In some embodiments, the disabling of manual control of the singulation parameter can occur when the controller is operating in an automatic mode. The processor can be further configured to enable manual control of the singulation parameter when the controller is operating in a manual mode.

According to a number of implementations, the present disclosure relates to a method for controlling a semiconductor wafer singulation apparatus. The method includes receiving an input signal having information about at least one singulation parameter. The method further includes generating an output signal based on the input signal to effectuate an operation associated with the singulation parameter. The method further includes disabling manual control of the singulation parameter.

In some teachings, the present disclosure relates to a controller module for a singulation apparatus. The module includes a processor configured to receive an input signal having information about at least one singulation parameter, to generate an output signal based on the input signal to effectuate an operation associated with the singulation parameter, and to disable manual control of the singulation parameter. The module further includes a plurality of connectors in communication with the processor. The plurality of connectors are configured to facilitate passing of the input and output signals, and disabling of the manual control of the singulation parameter. In some embodiments, the singulation apparatus can include a roller breaker apparatus.

In a number of implementations, the present disclosure relates to a kit for modifying a singulation apparatus. The kit includes a control module having a processor configured to receive an input signal having information about at least one singulation parameter, generate an output signal based on the input signal to effectuate an operation associated with the singulation parameter, and disable manual control of the singulation parameter.

In some embodiments, the module can further include a plurality of connectors configured to facilitate passing of the input and output signals, and disabling of the manual control of the singulation parameter. The kit can further include an instruction that includes steps for connecting the control module to the singulation apparatus. The instruction can further include steps for operating the modified singulation apparatus.

According to some implementations, the present disclosure relates to a singulation apparatus that includes a singulation component configured to separate a plurality of die from a semiconductor wafer. The singulation apparatus further includes a controller configured to control operation of the singulation component. The controller is configured to receive an input signal having information about at least one operating parameter of the singulation component and to generate an output signal based on the input signal to effectuate an operation associated with the singulation parameter. The controller is further configured to disable manual control of the singulation parameter.

In some embodiments, the singulation component can include a roller breaker. The singulation component can include a roller for mechanically breaking the wafer along a given direction.

In some embodiments, the singulation apparatus can further include a computer-readable medium in communication with the controller. The computer-readable medium can be configured to store at least some of the information. The controller can include a processor configured to perform at least some of the control of operation of the singulation component. The singulation apparatus can further include an interface component configured to facilitate the receiving of the input signal by the controller and the effectuating of the output signal generated by the controller. The singulation apparatus can further include an actuator configured to facilitate one or more singulation operations based on the output signal generated by the controller.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Described herein are systems, devices and methods for controlling how processed semiconductor wafers are broken up into a plurality of units typically referred to as die. Although described in the context of wafer breakers, it will be understood that one or more features of the present disclosure can be applied to other wafer-processing situations.

Figure 1:
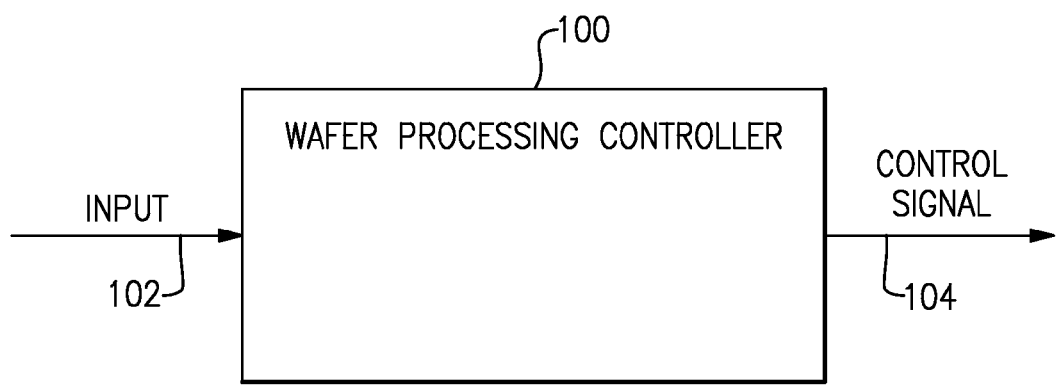
FIG. 1 schematically depicts a wafer processing controller that can be configured to provide one or more advantageous features as described herein.

FIG. 1 schematically depicts a wafer processing controller 100 that can be configured to provide one or more advantageous features as described herein. The controller 100 can receive one or more inputs 102 and generate one or more outputs 104 based at least in part on the input(s) 102. Examples of such inputs and how the controller 100 can generate such outputs are described herein in greater detail.

Figure 2:
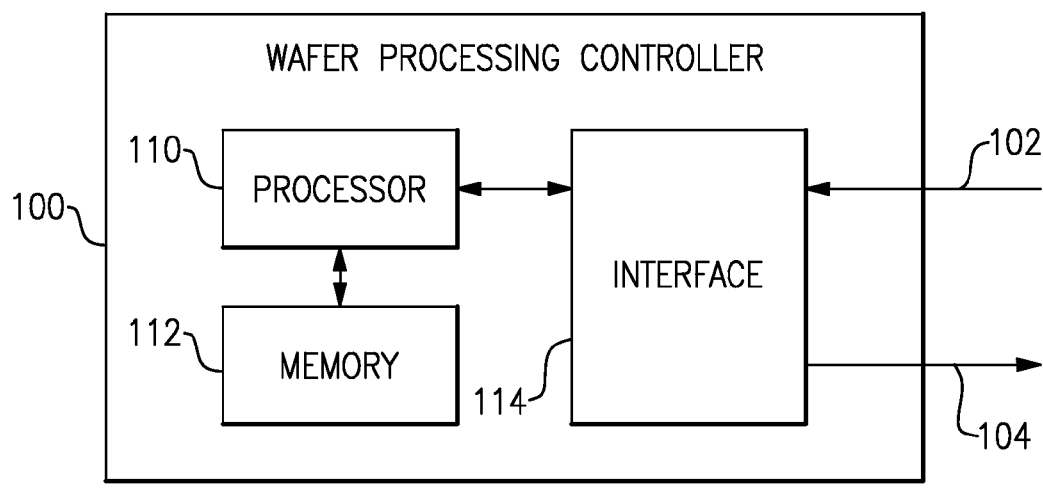
FIG. 2 shows that in some implementations, the wafer processing controller of FIG. 1 can include a number of components such as a processor and an interface.

FIG. 2 shows that in some implementations, the wafer processing controller 100 of FIG. 1 can include a number of components. For example, the controller 100 can include a processor 110 configured to process input(s) 102 and generate output(s) 104. Receiving of such input(s) 102 and sending or such output(s) 104 can be facilitated by an interface component 114.

In some implementations, executable instructions for one or more processes performed by the processor 110 and/or information (e.g., break-parameters for different wafer types) for facilitating such processes can be stored in a computer-readable storage medium depicted as a memory 112 in FIG. 2. In some implementations, such a memory can include a non-transitory medium. Examples of such information such as break-parameters are described herein in greater detail.

Figure 3:
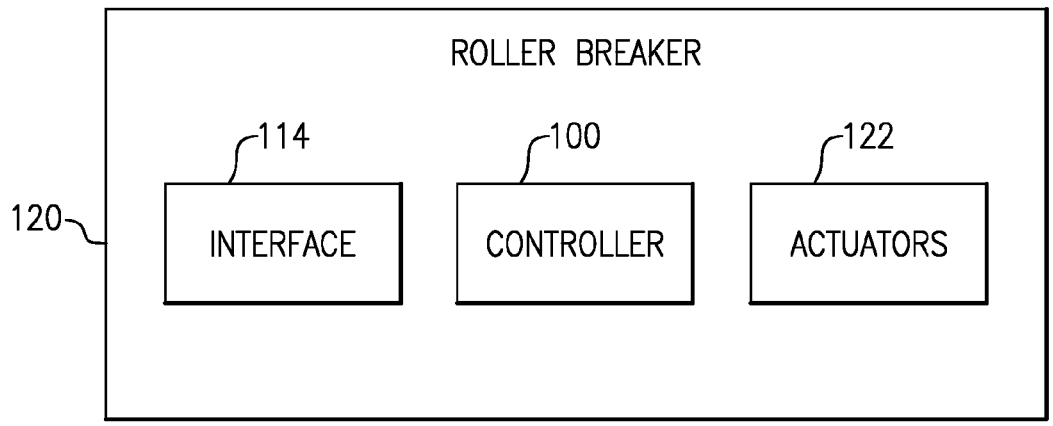
FIG. 3 schematically shows an example of a wafer-processing apparatus such as a roller breaker that can be controlled by the controller of FIG. 2.

FIG. 3 schematically shows an example of a wafer-processing apparatus (such as a roller breaker 120) that can be controlled by a controller 100 such as that described in reference to FIG. 2. In addition to the controller 100, the roller breaker 120 is shown to include an interface 114 that can be configured to provide, for example, input/output functionalities for the controller 100. In some embodiments, such output(s) generated by the controller 100 can be provided to one or more actuators 122 for effectuating various wafer-breaking operations.

Figure 4:
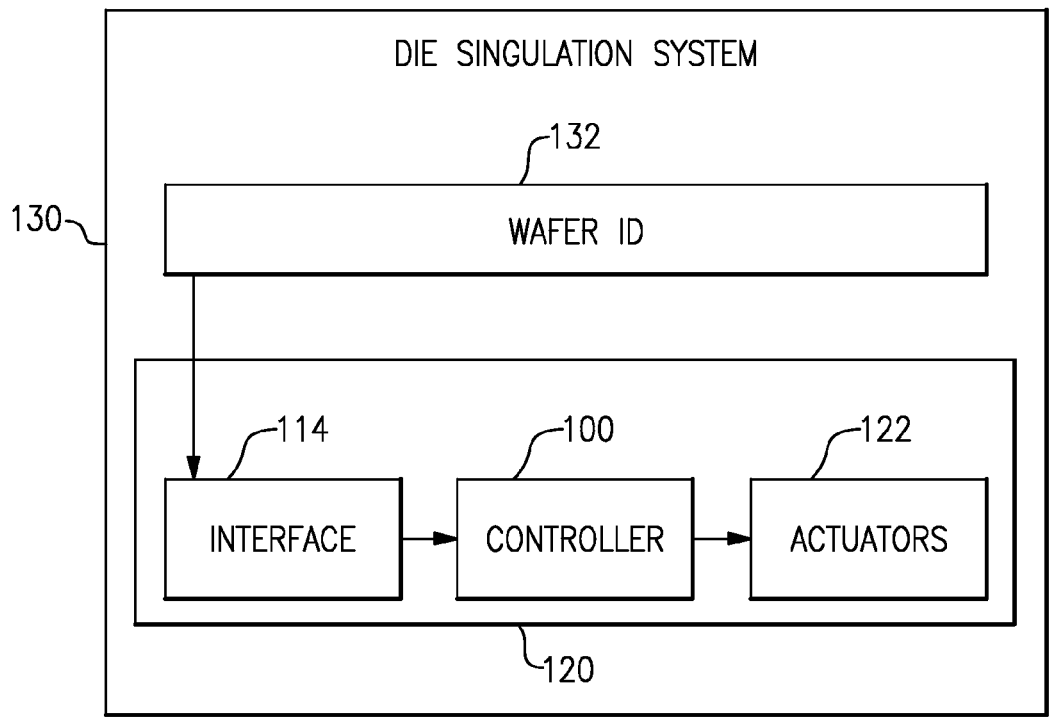
FIG. 4 schematically shows that in some embodiments, the roller breaker of FIG. 3 can be part of a die singulation system.

FIG. 4 schematically shows that in some embodiments, a roller breaker 120 such as that described in reference to FIG. 3 can be part of a die singulation system 130. Such a system can include a wafer identification component 132 configured to generate information about a wafer to be broken, and such information can be provided to the controller 100 of the roller breaker 120. Examples of such wafer information are described herein in greater detail.

Figure 5:
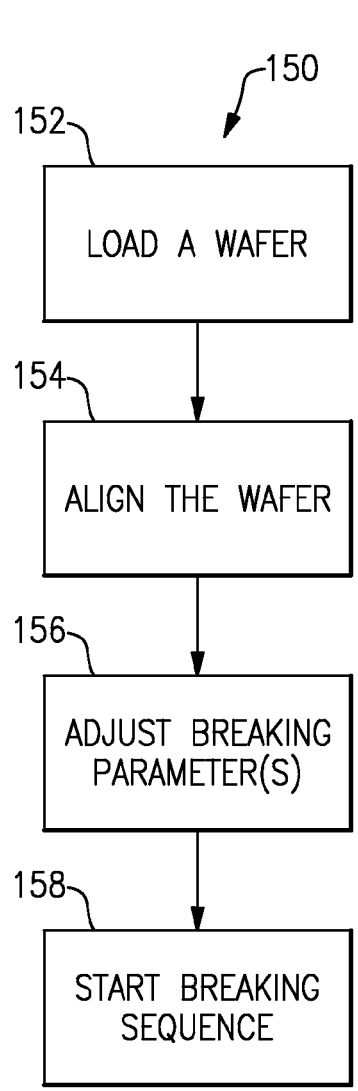
FIG. 5 shows a process that can represent operation of a roller breaker that does not have the controller of FIG. 4.
Figure 6:
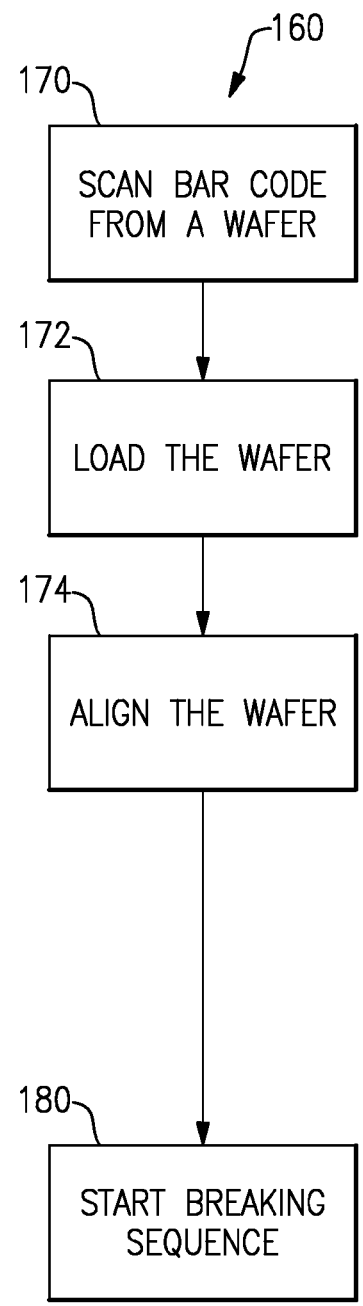
FIG. 6 shows a process that can represent operation of a roller breaker that includes the controller of FIG. 4.

FIG. 5 shows a process 150 that can represent operation of a roller breaker that does not have the controller 100 of FIG. 4. FIG. 6 shows a process 160 that can represent operation of a roller breaker that includes the controller 100 of FIG. 4.

In the process 150 of FIG. 5, a wafer to be broken into a plurality of dies can be loaded in a roller breaker apparatus in block 152. In block 154, the wafer can be aligned so that break directions substantially match, for example, scribed lines on the wafer with break directions. In block 156, one or more breaking parameters such as breaking pressures (e.g., along X and Y directions) and roller speed are typically set manually by an operator. In block 158, a breaking sequence can be performed based on such breaking parameter(s) set by the operator.

In the process 160 of FIG. 6, at least some of the one or more breaking parameters can be set automatically by a controller such as the controller 100 of FIGS. 3 and 4. In some implementations, the process 160 can include block 170 where information about a wafer to be broken can be obtained. For example, a bar code associated with the wafer can be scanned to transfer such information.

In block 172, the wafer can be loaded in a roller breaker apparatus having the controller 100 of FIGS. 3 and 4. In block 174, the wafer can be aligned so that break directions substantially match, for example, scribed lines on the wafer with break directions. In some implementations, process blocks 172 and 174 can be generally similar to those described in reference to process blocks 152 and 154 of FIG. 5.

In block 180, breaking sequence can be performed based on the breaking parameter(s) set by the controller. Accordingly, such an operation can be performed automatically by the controller, without manual setting performed by an operator.

Figure 7:
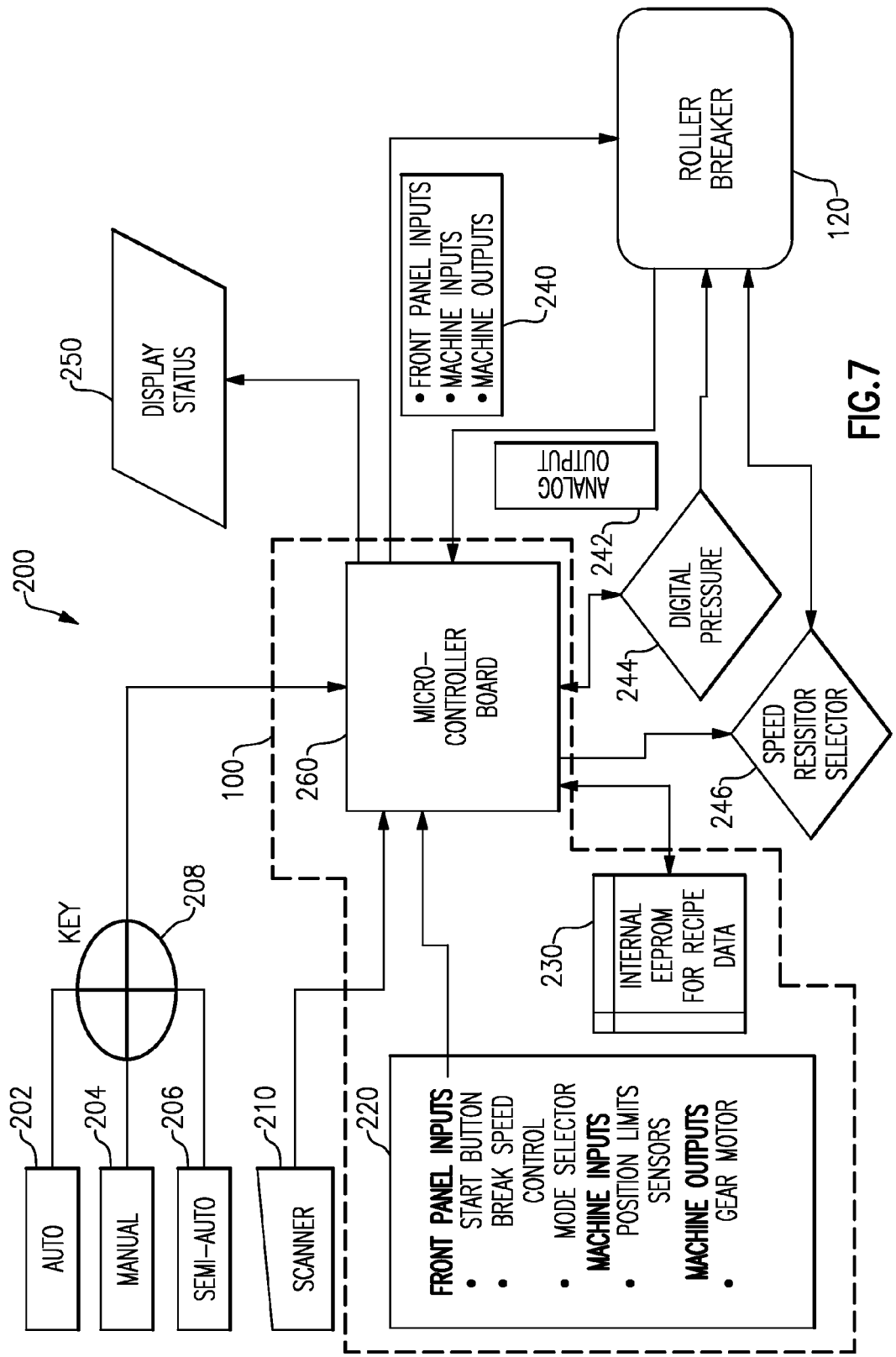
FIG. 7 schematically shows a control system that can be configured to allow control of wafer-breaking devices as described in reference to, for example, FIGS. 1-4 and 6.

FIG. 7 schematically shows a control system 200 that can be configured to allow control of wafer-breaking devices as described in reference to, for example, FIGS. 1-4 and 6. The control system 200 is shown to include a controller 100 that includes a micro-controller board 260 that can function as a processor.

The micro-controller 260 is shown to receive information about a given wafer from a scanner 210 such as a bar-code scanner. By way of an example, a bar-code for the wafer can be generated and printed based on optical character recognition (OCR) of information shipped with the wafer. Such a bar-code can include information that can facilitate breaking of the wafer. For example, a bar-code generated can include a code representative of breaking pressures and roller speed. By way of an example, a bar-code of "B121" can represent breaker codes ("B") "1" for pressure setting during the first pass (e.g., along X direction), "2" for pressure setting during the second pass (e.g., along Y direction), and "1" for roller speed setting during each of the first and second passes. In some implementations, the first and second passes can involve different roller speeds.

In some implementations, such breaker codes can be interpreted by the controller, and corresponding actuation signals can be generated for the automatic breaking operation. In some implementations, such translation of the breaker codes to the corresponding actuation signals can be based on, for example, one or more look-up tables stored in a computer-readable medium (e.g., memory 112 in FIG. 2, and an EEPROM 230 in FIG. 7). In some implementations, such resulting actuation signals can be similar to signals that would result if the roller breaker was to be operated by manually setting, for example, switches and/or dials to set the pressures and roller speed.

Although the foregoing automated operation in the example context of breaking pressure and roller speed settings, it will be understood that other operating parameters can be input (220) to the micro-controller 260 and be controlled automatically. For example, the micro-controller 260 can be configured to control other operating parameters associated with a control panel of a given roller breaker. Such operating parameters can involve a start command (e.g., which would be generated if a start button is pressed manually), and a mode selection command (e.g., which would be generated by a mode-select knob).

In another example, the micro-controller 260 can also be configured to control operating parameters associated with one or more machine inputs. By way of an example, signals associated with position limits sensors can be provided to the micro-controller 260, and one or more controls signals can be generated to allow partially or fully automated operations involving such position limits.

In yet another example, the micro-controller 260 can also be configured to control operating parameters associated with one or more machine outputs. By way of an example, signals associated with one or more gear motors can be provided to the micro-controller 260, and one or more controls signals can be generated to allow partially or fully automated operations involving such gear motors.

FIG. 7 further shows that control signals 240 based on the foregoing inputs (e.g., those associated with front control panel, machine inputs, and machine outputs) can be provided to the roller breaker 120 to allow partial or full automated operation. In some embodiments, the foregoing machine-related (e.g., machine inputs and/or machine outputs) signals provided to the micro-controller 260 can include analog signals 242 sent from the roller breaker 120.

FIG. 7 further shows that the foregoing control signals generated by the micro-controller 260 can include analog and/or digital signals. By way of examples, such control signals are shown to effectuate a roller speed adjustment resistance 246 and breaking pressure adjustments 244 that are applied to the roller breaker 120.

FIG. 7 further shows that in some embodiments, the micro-controller 260 can be configured appropriately and connected to a display to display information such as status (250) of one or more operating conditions or parameters before, during, and/or after the breaking operation.

In some situations, it may be desirable to operate an automated-operation capable roller breaker system manually. Thus, in some embodiments, a selection switch such as a selector key 208 can be provided to allow operations that are automatic (202), manual (204), or any combination thereof (e.g., semi-auto 206). Such a keyed selector switch can allow the roller breaker system to be set and locked in a given mode (e.g., auto mode 202) and inhibit unwanted mode changes.

In some embodiments, the micro-controller 260 can be configured to be programmable to provide flexibility in a number of roller breaking applications.

Figure 8:
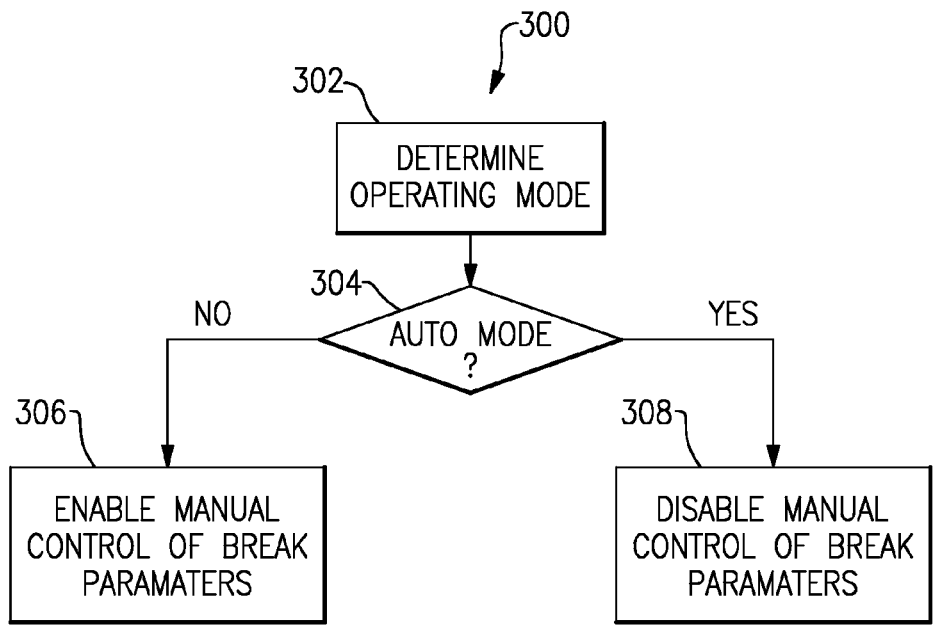
FIG. 8 shows that in some embodiments, a safe-guard feature can be implemented to inhibit manual control of one or more break parameters when a roller breaker is being operated automatically.

In some implementations, a safe-guard feature can be implemented to inhibit manual control of one or more break parameters (e.g., pressure settings and/or roller speed) when a roller breaker is being operated automatically. FIG. 8 shows a process 300 that can be implemented to provide such functionality. In block 302, an operating mode of a roller breaker can be determined. In a decision block 304, the process 300 can determine whether the operating mode is an auto mode. If "Yes," manual control of one or more break parameters associated with the auto mode can be disabled in block 308. If "No," manual control of one or more break parameters associated with the determined non-auto mode can be enabled in block 306.

Figure 9:
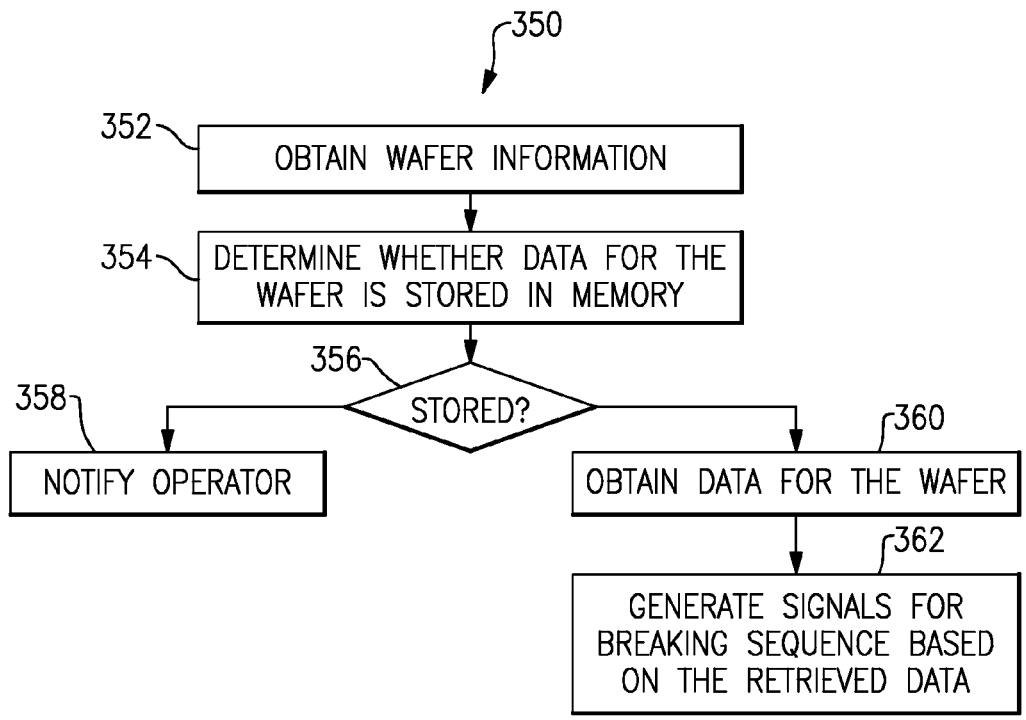
FIG. 9 shows a process that can be implemented to determine whether information about a wafer being processed is stored in a storage medium, and if so, obtain the information therefrom.

In some implementations, control signals for automated operation of a roller breaker can be generated as shown in an example process 350 of FIG. 9. In block 352, wafer information related to the roller breaker can be obtained. The above-described "B121" wafer information can be an example of such wafer information. In block 354, the process 350 can determine whether data corresponding to such wafer information is stored in a memory. If the answer is "No" in a decision block 356, a notification can be provided to the roller breaker operator in block 358. If the answer is "Yes" in the decision block 356, such data can be obtained from the memory in block 360. In block 362, signals for a breaking sequence can be generated based on the retrieved data.

Figure 10:
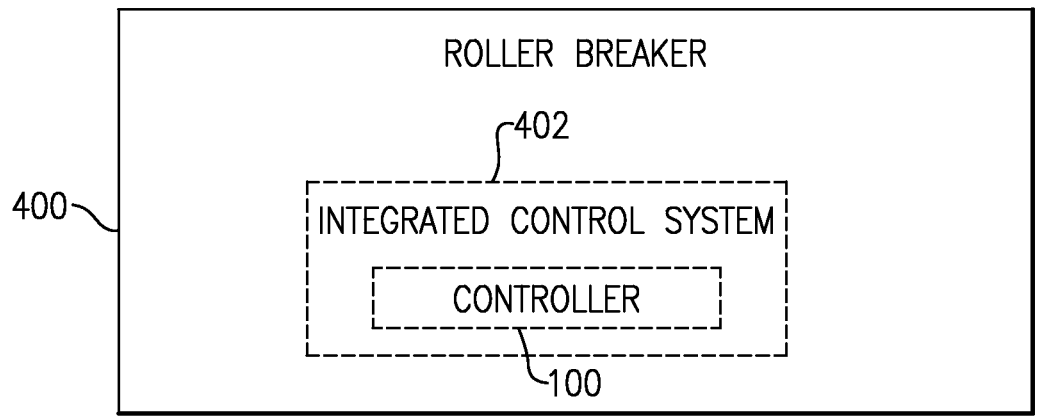
FIG. 10 shows that in some embodiments, a controller having one or more features as described herein can be part of an integrated control system built into a roller breaker.

One or more features of the present disclosure can be implemented in a number of ways. For example, FIG. 10 shows that in some implementations, a controller 100 having one or more features as described herein can be part of an integrated control system 402 built into a roller breaker 400. In some embodiments, such a control system (402) can be integrated with other parts of the roller breaker 400 during the manufacturing process.

Figure 11:
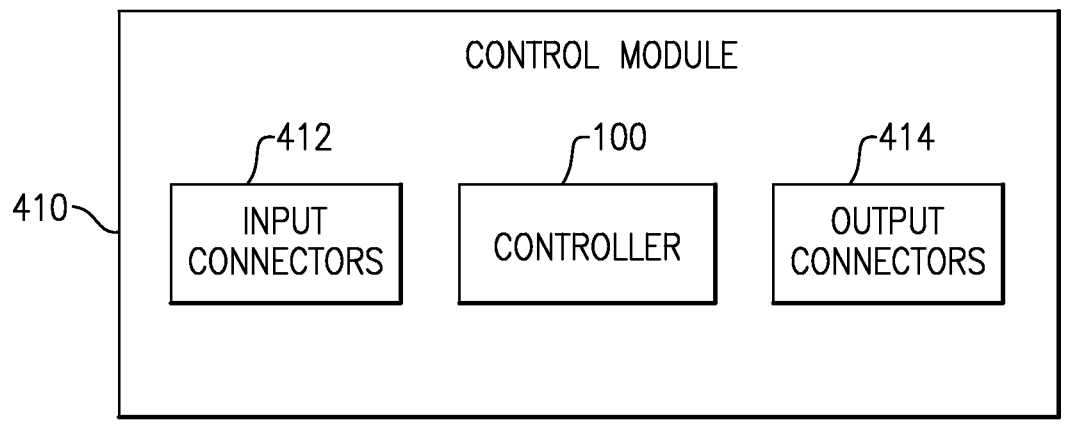
FIG. 11 shows that in some embodiments, a controller having one or more features as described herein can be included in a control module.

In another example, FIG. 11 shows that in some implementations, a controller 100 having one or more features as described herein can be included in a control module 410. Such a module can be provided to a manufacturer of a roller breaker in a modular form to be included in the manufactured roller breaker. Such a module can also be provided to users of existing manually-controlled roller breakers. To facilitate either or both of such examples, the control module 410 can include, for example, input connectors 412 and output connectors 414.

In some embodiments, the example module 410 of FIG. 11 can be provided as a kit to facilitate, for example, retro-fit of existing roller breaker equipments. Aside from the module itself, such a kit can include, for example, a printed instruction for connecting the various inputs and outputs for the controller 100, as well as operating of such a controller. In another example, such a kit can also include one or more connection-related parts (e.g., wires) to facilitate connections of the inputs and/or outputs.

A roller breaker having one or more features as described herein can be beneficial in a number of ways. For example, likelihood of a wrong setup due to operator-error can be reduced; and such a reduction can reduce the likelihood of destroying a wafer due to the wrong setup. Applicant has observed that in example singulation operations (by roller breakers), manual operations provided a yield of about 95.9%, while automated operations as described herein provided a yield of about 96.4%.

In another example, time associated with manual setup and adjustments can be reduced or eliminated. Applicant has observed that in some singulation operations, a given wafer can take about 3.0 minutes on average to manually control various roller breaking parameters, while automation of such parameters as described herein yield an average of about 1.5 minutes per wafer.

The foregoing examples of roller breaking performance improvements have been observed where the manual operations were performed utilizing commercially available Loomis roller breakers (e.g., LSD-100 series roller breakers). The example automated operations were performed by adding a controller as described herein to such Loomis roller breakers.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A controller for a semiconductor wafer singulation apparatus, the controller comprising a processor configured to:
   receive an input signal having information about at least one singulation parameter;
   generate an output signal based on the input signal to effectuate an operation associated with the singulation parameter; and
   disable manual control of the singulation parameter.

2. The controller of claim 1 wherein the singulation apparatus includes a roller breaker apparatus.

3. The controller of claim 2 wherein the at least one singulation parameter includes a first pressure setting for applying pressure along a first direction of a wafer.

4. The controller of claim 3 wherein the at least one singulation parameter further includes a second pressure setting for applying pressure along a second direction of the wafer.

5. The controller of claim 2 wherein the at least one singulation parameter includes a roller speed setting.

6. The controller of claim 2 further comprising a memory in communication with the processor, the memory configured to store at least a portion of the information about the singulation parameter.

7. The controller of claim 6 wherein the processor is configured to determine whether the information about the singulation parameter is stored in the memory.

8. The controller of claim 7 wherein the processor is configured to obtain the information about the singulation parameter from the memory if the information is stored in the memory.

9. The controller of claim 8 wherein the processor is further configured to notify an operator if the information about the singulation parameter is not stored in the memory.

10. The controller of claim 2 wherein the controller is an integral part of the singulation apparatus.

11. The controller of claim 2 wherein the controller is an add-on component for the singulation apparatus.

12. The controller of claim 2 wherein the disabling of manual control of the singulation parameter occurs when the controller is operating in an automatic mode.

13. The controller of claim 12 wherein the processor is further configured to enable manual control of the singulation parameter when the controller is operating in a manual mode.

14. A method for controlling a semiconductor wafer singulation apparatus, the method comprising:
    receiving an input signal having information about at least one singulation parameter;
    generating an output signal based on the input signal to effectuate an operation associated with the singulation parameter; and
    disabling manual control of the singulation parameter.

15. A singulation apparatus comprising:
    a singulation component configured to separate a plurality of die from a semiconductor wafer; and
    a controller configured to control operation of the singulation component, the controller configured to receive an input signal having information about at least one operating parameter of the singulation component and to generate an output signal based on the input signal to effectuate an operation associated with the singulation parameter, the controller further configured to disable manual control of the singulation parameter.

16. The singulation apparatus claim 15 wherein the singulation component includes a roller breaker.

17. The singulation apparatus claim 16 wherein the singulation component includes a roller for mechanically breaking the wafer along a given direction.

18. The singulation apparatus of claim 15 further comprising a computer-readable medium in communication with the controller, the computer-readable medium configured to store at least some of the information.

19. The singulation apparatus of claim 15 wherein the controller includes a processor configured to perform at least some of the control of operation of the singulation component.

20. The singulation apparatus of claim 19 further comprising an actuator configured to facilitate one or more singulation operations based on the output signal generated by the controller.

* * * * *